(12) United States Patent
Hida et al.

(10) Patent No.: US 7,224,217 B2
(45) Date of Patent: May 29, 2007

(54) SWITCHING AMPLIFIER

(75) Inventors: Kazuhiro Hida, Neyagawa (JP); Joji Kasai, Neyagawa (JP); Yoshitaka Handa, Sakai (JP); Sou Fujioka, Neyagawa (JP); Mamoru Sekiya, Neyagawa (JP)

(73) Assignee: Onkyo Corporation, Neyagawa (JP)

( * ) Notice: Subject to any disclaimer, the term of this patent is extended or adjusted under 35 U.S.C. 154(b) by 174 days.

(21) Appl. No.: 11/068,107

(22) Filed: Feb. 28, 2005

(65) Prior Publication Data

US 2005/0212592 A1 Sep. 29, 2005

(30) Foreign Application Priority Data

Mar. 26, 2004 (JP) .............................. 2004-091521

(51) Int. Cl.
*H03F 3/38* (2006.01)
(52) U.S. Cl. ..................... 330/10; 330/251; 330/207 A
(58) Field of Classification Search .................. 330/10, 330/251, 207 A
See application file for complete search history.

(56) References Cited

U.S. PATENT DOCUMENTS

| 4,255,694 | A | * | 3/1981 | Morris et al. ............... 318/565 |
| 4,622,480 | A | * | 11/1986 | Uchimura et al. .......... 327/337 |
| 6,232,833 | B1 | * | 5/2001 | Pullen ......................... 330/10 |
| 6,924,700 | B2 | | 8/2005 | Taura et al. |

2006/0132231 A1 6/2006 Ishii et al.

FOREIGN PATENT DOCUMENTS

| JP | 56-152415 | 11/1981 |
| JP | 61-39708 | 2/1986 |
| JP | 02-125507 | 5/1990 |
| JP | 03-132206 | 6/1991 |
| JP | 03-159409 | 7/1991 |
| JP | 3394116 | 2/1997 |
| JP | 3338847 | 6/1998 |
| JP | 2002-151979 | 5/2002 |
| JP | 3338847 | 8/2002 |
| JP | 3394116 | 1/2003 |
| JP | 2004-172715 | 6/2004 |
| JP | 2004-180294 | 6/2004 |

* cited by examiner

*Primary Examiner*—Patricia Nguyen
(74) *Attorney, Agent, or Firm*—Renner, Otto, Boisselle & Sklar, LLP

(57) ABSTRACT

A switching amplifier including a PWM circuit 14, a driver 15, a switching output circuit 16 and an LPF 17 is provided with a fluctuation detection circuit 12 for detecting fluctuations in the power supply voltage. The fluctuation detection circuit 12 includes detection resistors 122 and 123 connected in series between a positive power supply 19 and a negative power supply 20. A fluctuating signal RPL occurring at a fluctuation detection terminal 121 is supplied to the inverted input terminal of a differential amplifier 131 of a non-inverted amplifier circuit 13. The non-inverted amplifier circuit 13 inverts the fluctuating signal RPL, mixes the inverted fluctuating signal into the input signal $e_S$, amplifies the mixed signal, and supplying the amplified signal to the PWM circuit 14.

8 Claims, 15 Drawing Sheets

SWITCHING AMPLIFIER

BACKGROUND OF THE INVENTION

1. Field of the Invention

The present invention relates to a switching amplifier, and more particularly to a switching amplifier for use as a class-D audio amplifier.

2. Description of the Related Art

A switching amplifier, which is also commonly called a "digital amplifier", includes a pulse width modulation (PWM) circuit, a driver, a switching output circuit, and a low-pass filter (LPF). The PWM circuit outputs a PWM signal having a pulse width according to the level of the input signal. The driver outputs a driving signal according to the PWM signal. The switching output circuit includes a power MOS-FET connected to a positive power supply, and another power MOS-FET connected to a negative power supply. The driver selectively turns ON one of the power MOS-FETs connected to the positive and negative power supplies in response to the PWM signal so that the switching output circuit outputs a positive or negative power supply voltage.

When a sine-wave input signal is received, if the positive and negative power supply voltages V and −V are constant as shown in FIG. 21, the switching amplifier can produce a regular sine-wave output signal. However, if a power supply voltage is not constant as shown in FIG. 22, the switching amplifier cannot produce a regular sine-wave output signal. Although FIG. 22 shows a case where the negative power supply voltage is constant and only the positive power supply voltage is fluctuating, for the sake of simplicity, it is typically the case that both of the power supply voltages fluctuate.

For example, when a commercial AC power supply is rectified to obtain a DC power supply, the power supply voltage will contain ripples. Since a switching amplifier outputs the power supply voltage as it is, ripples in the power supply voltage will be in the output signal, thus causing so-called "ham noise".

Moreover, if there is a difference between the absolute value of the positive power supply voltage and that of the negative power supply voltage, a half of that difference will be output (DC offset).

FIG. 23 shows an FFT (Fast Fourier Transform) waveform of an output signal obtained when the input signal is zero where a 50 Hz AC power supply is used. As is apparent from FIG. 23, substantial amounts of ripples having frequency companent of integer multiples of 50 Hz are contained. Although not shown in this figure, a DC offset is also contained.

Various other types of noise may be introduced into a power supply voltage, in addition to those introduced when an AC power supply is rectified to obtain a DC power supply. Then, a switching amplifier will output such noise as it is.

Japanese Patent No. 3394116 discloses a power supply ripple suppressing circuit for a differential amplifier. The differential amplifier is not a switching amplifier but is an ordinary analog amplifier. As shown in FIG. 1 of Japanese Patent No. 3394116, a resistor R12 and an impedance element Z3 are connected in series between the inverted input terminal of the differential amplifier 1 and the ground. An impedance element Z1 is connected between a node T1 (a node between the resistor R12 and the impedance element Z3) and a positive power supply +B, and an impedance element Z2 is connected between the node T1 and a negative power supply −B. Since the differential amplifier is an analog amplifier, impedance value of the impedance element Z1, Z2 are capable of being larger, so that amount of current which flow through the impedance element Z1, Z2 can be smaller. In the case that the differential amplifier is used in a switching amplifier, it is necessary that the impedance values of the impedance element Z1, Z2 are set smaller. In result, since a large amount of power is consumed at the impedance element Z1, Z2, the differential amplifier is not practical as a switching amplifier.

SUMMARY OF THE INVENTION

It is therefore an object of the present invention to provide a switching amplifier capable of reducing the amount of power supply noise to be contained in the output. It is also an object of the present invention to provide a switching amplifier capable of canceling out the power supply noise contained in the output.

A switching amplifier of the present invention includes a pulse modulation circuit, a switching output circuit, a fluctuation detection circuit and an inversion circuit. The pulse modulation circuit outputs a pulse-modulated signal in response to an input signal. The switching output circuit is connected to a power supply for outputting a power supply voltage in response to the pulse-modulated signal. The fluctuation detection circuit detects a fluctuating component contained in the power supply voltage. The inversion circuit inverts the fluctuating component detected by the fluctuation detection circuit and mixes the inverted fluctuating component into the input signal.

For example, the pulse modulation circuit may be a PWM circuit or a PDM (Pulse Density Modulation) circuit. A PWM circuit modulates the pulse width of the input signal to obtain a PWM signal. A PDM circuit modulates the pulse density of the input signal to obtain a PDM signal.

With this switching amplifier, a fluctuating component contained in the power supply voltage is detected, inverted and mixed into the input signal. The input signal containing the inverted fluctuating component is amplified to be the power supply voltage by the pulse modulation circuit and the switching output circuit. Therefore, the amount of the fluctuating component contained in the power supply voltage is reduced and will not be output.

Another switching amplifier of the present invention includes a pulse modulation circuit, a switching output circuit, first and second resistors and an inversion circuit. The pulse modulation circuit outputs a pulse-modulated signal in response to an input signal supplied to an input terminal thereof. The switching output circuit is connected to first and second power supplies for outputting a first or second power supply voltage in response to the pulse-modulated signal. The first resistor is connected between the first power supply and a fluctuation detection terminal. The second resistor is connected between the second power supply and the fluctuation detection terminal. The inversion circuit inverts a fluctuating signal occurring at the fluctuation detection terminal and mixing the inverted fluctuating signal into the input signal.

Specifically, the first and second power supply voltages are voltages that are generally symmetrical with each other with respect to a reference potential. Therefore, one of the first and second power supply voltages may be a ground potential. Alternatively, the first and second power supply voltages may be both positive power supply voltages or may be both negative power supply voltages. For example, where the ground potential is the reference potential, the first and second power supply voltages are positive and negative power supply voltages whose absolute values are generally equal to each other.

With this switching amplifier, a fluctuating component contained in the first or second power supply voltage is detected, inverted and mixed into the input signal. The input signal containing the inverted fluctuating component is amplified to be the first or second power supply voltage by the pulse modulation circuit and the switching output circuit. Therefore, the amount of the fluctuating component contained in the first or second power supply voltage is reduced and will not be output.

Preferably, the inversion circuit includes a non-inverted amplifier circuit for amplifying the input signal and supplying the amplified input signal to the pulse modulation circuit. More preferably, the non-inverted amplifier circuit includes a differential amplifier and third and fourth resistors. The differential amplifier includes a non-inverted input terminal connected to the input terminal and an inverted input terminal connected to the fluctuation detection terminal. The third resistor is connected between an output terminal of the switching output circuit and the inverted input terminal of the differential amplifier. The fourth resistor is connected between the inverted input terminal of the differential amplifier and a ground.

More preferably, where $2R_3$ denotes a resistance value of the first and second resistors, $R_1$ that of the third resistor, $R_2$ that of the fourth resistor and A an open-loop gain of the differential amplifier, $R_1$ to $R_3$ and A satisfy Expression 1 below.

$$R_3 = \frac{(A-1)R_1 R_2}{(A+1)R_2 + R_1} \quad (1)$$

Then, the fluctuating component contained in the first or second power supply voltage is canceled out substantially completely, and will not substantially be output.

Preferably, the switching amplifier further includes a variable resistor connected between the fluctuation detection terminal and the inverted input terminal of the differential amplifier.

Then, it is possible to manually or automatically adjust the variable resistor so that the fluctuating component contained in the first or second power supply voltage is canceled out substantially completely and will not substantially be output.

Preferably, the switching amplifier further includes a non-inverted amplifier circuit for amplifying the input signal and supplying the amplified input signal to the pulse modulation circuit. The non-inverted amplifier circuit includes a first differential amplifier and third and fourth resistors. The first differential amplifier includes a non-inverted input terminal connected to the input terminal and an inverted input terminal. The third resistor is connected between an output terminal of the switching output circuit and the inverted input terminal of the first differential amplifier. The fourth resistor is connected between the inverted input terminal of the first differential amplifier and a ground. The inversion circuit includes a second differential amplifier and fifth to seventh resistors. The second differential amplifier includes a non-inverted input terminal connected to a ground and an inverted input terminal connected to the fluctuation detection terminal. The fifth resistor is connected between an output terminal of the second differential amplifier and the inverted input terminal of the second differential amplifier. The sixth resistor is connected between the output terminal of the second differential amplifier and the non-inverted input terminal of the first differential amplifier. The seventh resistor is connected between the input terminal and the non-inverted input terminal of the first differential amplifier.

More preferably, where $R_4$ denotes a resistance value of the first and second resistors, $R_1$ that of the third resistor, $R_2$ that of the fourth resistor, $R_5$ that of the fifth resistor, $R_6$ that of the sixth resistor, $R_7$ that of the seventh resistor and A an open-loop gain of the first differential amplifier, $R_1$, $R_2$, $R_4$ to $R_7$ and A satisfy Expression 2 below.

$$\left(\frac{R_7}{R_6 + R_7}\right)\left(\frac{2R_5}{R_4}\right)\left\{\frac{A(R_1 + R_2)}{(1+A)R_2 + R_1}\right\} = 1 \quad (2)$$

Then, the fluctuating component contained in the first or second power supply voltage is canceled out substantially completely, and will not substantially be output.

Preferably, the inversion circuit includes an inverted amplifier circuit for amplifying the input signal and supplying the amplified input signal to the pulse modulation circuit. More preferably, the inverted amplifier circuit includes a differential amplifier and third and fourth resistors. The differential amplifier includes a non-inverted input terminal connected to a ground and an inverted input terminal connected to the fluctuation detection terminal. The third resistor is connected between an output terminal of the switching output circuit and the inverted input terminal of the differential amplifier. The fourth resistor is connected between the input terminal and the inverted input terminal of the differential amplifier.

More preferably, where $R_4$ denotes a resistance value of the first and second resistors, $R_1$ that of the third resistor, $R_2$ that of the fourth resistor and A an open-loop gain of the differential amplifier, $R_1$, $R_2$, $R_4$ and A satisfy Expression 3 below.

$$R_4 = \frac{2(A-1)R_1 R_2}{(A+1)R_2 + R_1} \quad (3)$$

Then, the fluctuating component contained in the first or second power supply voltage is canceled out substantially completely, and will not substantially be output.

DETAILED DESCRIPTION OF THE PREFERRED EMBODIMENTS

Figure 1:
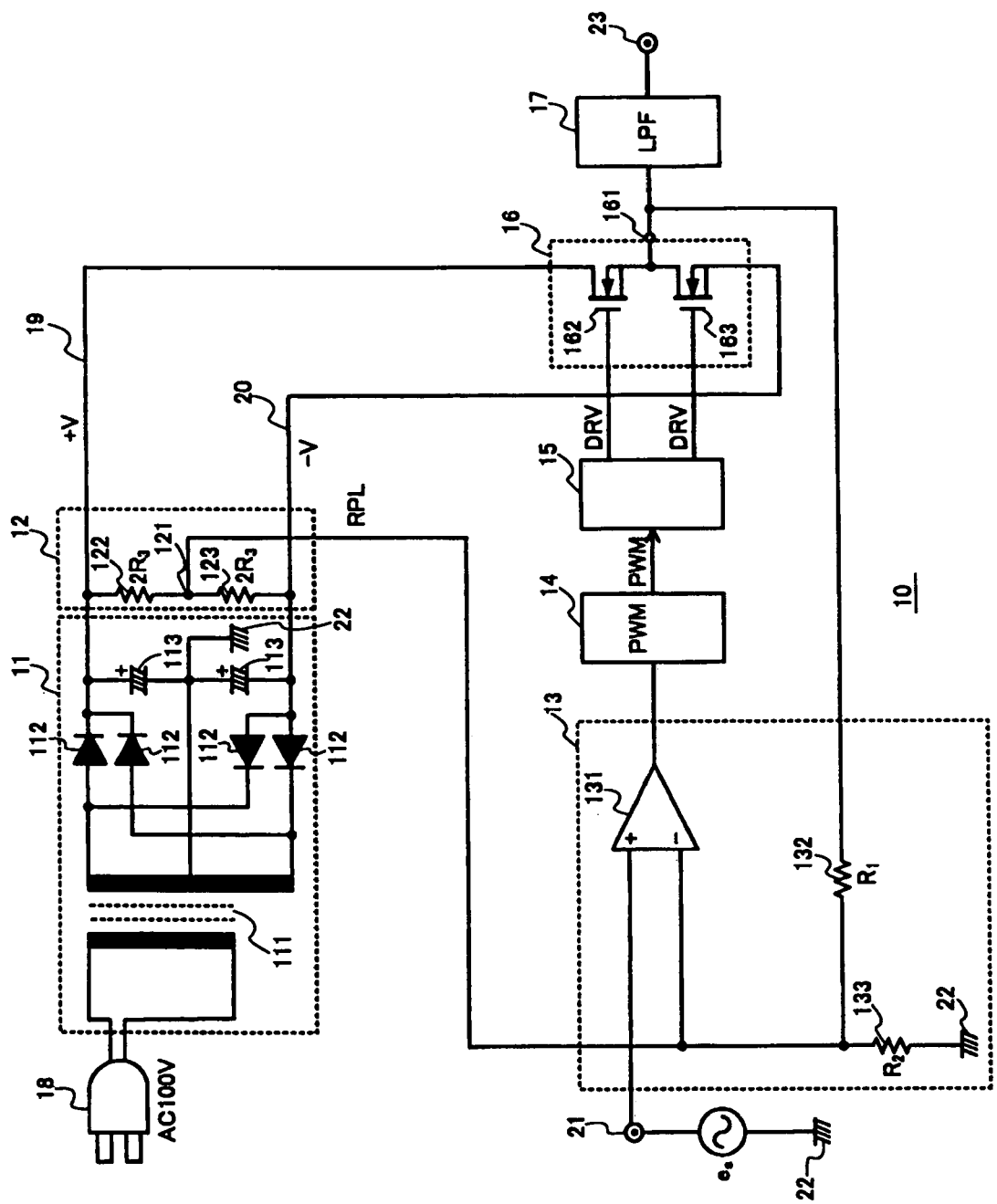
FIG. 1 is a functional block diagram showing a configuration of a switching amplifier according to a first embodiment of the present invention.

Preferred embodiments of the present invention will now be described in detail with reference to the drawings. Like elements are denoted by like reference numerals throughout the various figures, and will not be described repeatedly.

First Embodiment

Referring to FIG. 1, a switching amplifier 10 according to a first embodiment of the present invention includes a power supply circuit 11, a fluctuation detection circuit 12, a non-inverted amplifier circuit 13, a PWM circuit 14, a driver 15, a switching output circuit 16 and an LPF 17. The power supply circuit 11, the PWM circuit 14, the driver 15, the switching output circuit 16 and the LPF 17, per se, may be those well known in the art.

The power supply circuit 11 includes a transformer 111 for voltage transformation, diodes 112 for full-wave rectification and smoothing capacitors 113, and generates a positive power supply voltage +V (e.g., +50 V DC) and a negative power supply voltage −V (e.g., −50 V DC) based on a commercial power supply (e.g., 100 V AC) 18.

The fluctuation detection circuit 12 includes a detection resistor 122 connected between a positive power supply 19 and a fluctuation detection terminal 121, and a detection resistor 123 connected between a negative power supply 20 and the fluctuation detection terminal 121, and detects a fluctuating component contained in the power supply voltage.

The non-inverted amplifier circuit 13 amplifies an input signal $e_S$ supplied to an input terminal 21 of the switching amplifier 10 to give the amplified signal to the PWM circuit 14, while inverting a fluctuating signal RPL occurring at the fluctuation detection terminal 121 and mixing the inverted signal into the input signal $e_S$. The non-inverted amplifier circuit 13 includes a differential amplifier 131, a negative feedback resistor 132 and a grounded resistor 133. The differential amplifier 131 includes a non-inverted input terminal connected to the input terminal 21 and an inverted input terminal connected to the fluctuation detection terminal 121. The negative feedback resistor 132 is connected between an output terminal 161 of the switching output circuit 16 and the inverted input terminal of the differential amplifier 131. The grounded resistor 133 is connected between the inverted input terminal of the differential amplifier 131 and a ground 22.

The PWM circuit 14 modulates the pulse width of the input signal $e_S$ to obtain a modulated signal PWM. The driver 15 outputs a driving signal DRV in response to the modulated signal PWM.

The switching output circuit 16 is connected between the positive power supply 19 and the negative power supply 20, and outputs a positive power supply voltage +V or a negative power supply voltage −V in response to the driving signal DRV. Specifically, the switching output circuit 16 includes transistors (power MOS-FETs) 162 and 163. The transistor 162 has a drain connected to the positive power supply 19, a source connected to the output terminal 161, and a gate connected to an output terminal of the driver 15. The transistor 163 has a source connected to the negative power supply 20, a drain connected to the output terminal 161, and a gate connected to an output terminal of the driver 15.

The LPF 17 is connected between the output terminal 161 of the switching output circuit 16 and an output terminal 23 of the switching amplifier 10, and removes high-frequency components to obtain an output signal.

Where $R_1$ is the resistance value of the negative feedback resistor 132, $R_2$ is that of the grounded resistor 133, $2R_3$ is that of the detection resistors 122 and 123, and A is the open-loop gain of the differential amplifier 131, $R_1$ to $R_3$ and A are set so as to satisfy Expression 1 below.

$$R_3 = \frac{(A-1)R_1 R_2}{(A+1)R_2 + R_1} \quad (1)$$

Next, the operation of the switching amplifier 10 will be described.

First, a basic operation will be described.

The input signal $e_S$ is amplified through the non-inverted amplifier circuit 13, and the pulse width thereof is modulated by the PWM circuit 14. The modulated signal PWM output from the PWM circuit 14 has a pulse width according to the level of the input signal $e_S$. The modulated signal PWM is voltage-transformed by the driver 15, thereby obtaining the driving signal DRV capable of driving the gates of the transistors 162 and 163.

In the switching output circuit 16, the transistor 162 or 163 are selectively turned ON in response to the driving signal DRV. When the transistor 162 is turned ON, the positive power supply voltage +V is output. When the transistor 163 is turned ON, the negative power supply voltage −V is output.

The output signal of the switching output circuit 16 is supplied to the LPF 17, which removes the high-frequency components thereof occurring due to the switching operations of the transistors 162 and 163, thus obtaining the output signal of the switching amplifier 10. The output signal is an amplified version of the input signal $e_S$.

The switching amplifier 10 is provided with the fluctuation detection circuit 12, and the difference between the positive and negative power supply voltages (2 V) is divided by the detection resistors 122 and 123 and supplied to the inverted input terminal of the differential amplifier 131 as the fluctuating signal RPL. Therefore, the fluctuating signal RPL is inverted through the differential amplifier 131 and mixed into the input signal $e_S$.

Figure 2:
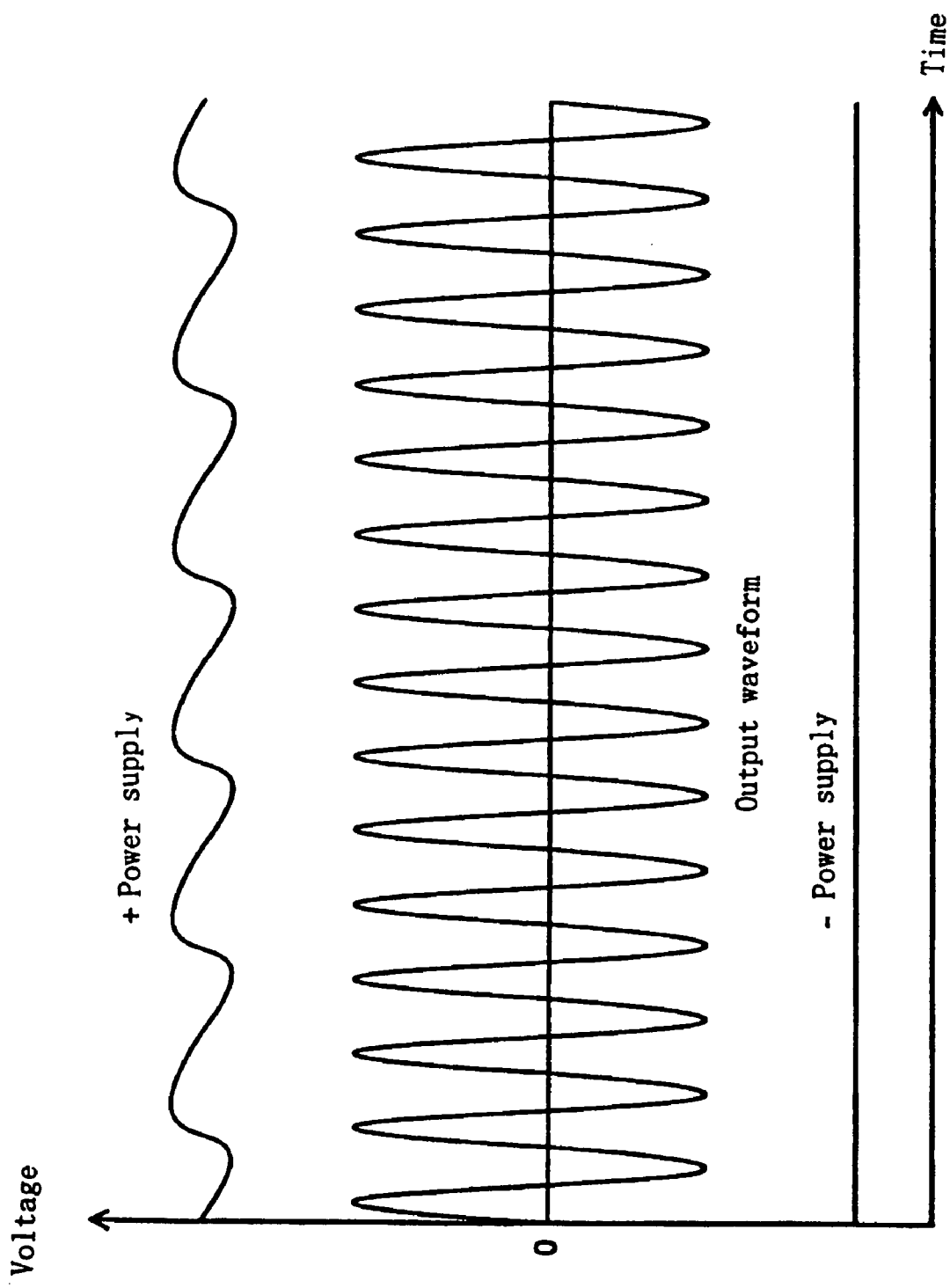
FIG. 2 is a waveform diagram showing an output signal from the switching amplifier shown in FIG. 1 in response to a sine-wave input signal where ripples are contained in the power supply voltage.

Herein, $R_1$ to $R_3$ and A satisfy Expression 1 above. Therefore, even if the power supply voltage contains a fluctuating component such as ripples, the fluctuating component will be canceled out and will not be contained in the output signal. FIG. 2 shows the waveform of an output signal obtained when the switching amplifier 10 amplifies the sine-wave input signal $e_S$ where ripples are contained in the power-supply voltage. As shown in FIG. 2, ripples are canceled out and are absent in the output signal.

Figure 3:
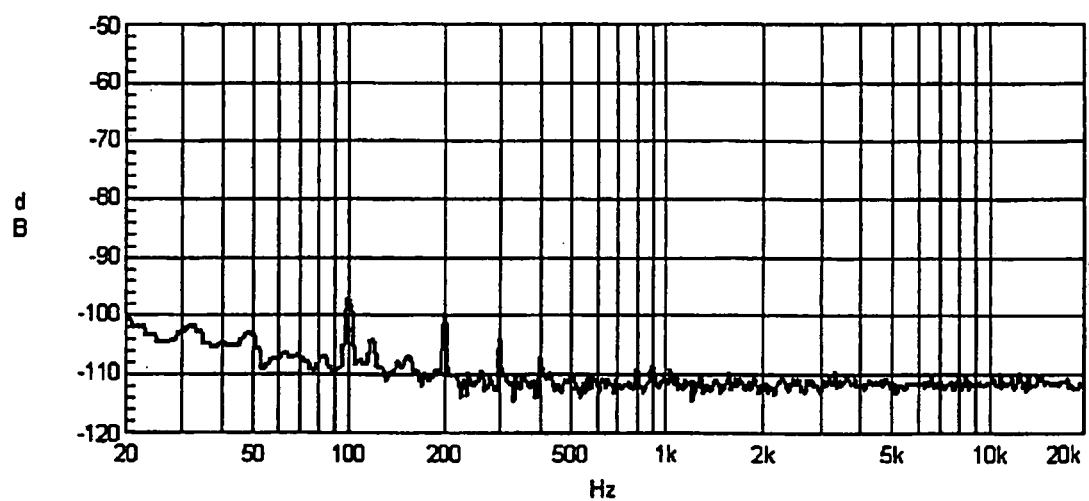
FIG. 3 is an FFT waveform diagram showing an output signal in response to a zero input signal where a 50 Hz AC power supply is rectified to obtain a DC voltage.
Figure 23:
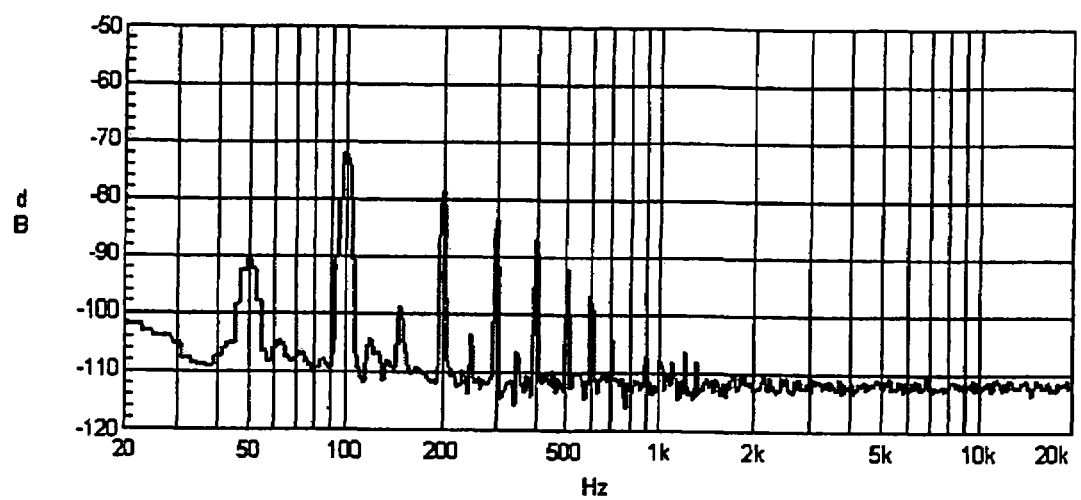
FIG. 23 is an FFT waveform diagram showing an output signal in response to a zero input signal where a 50 Hz AC power supply is rectified to obtain a DC voltage.

FIG. 3 shows an FFT (Fast Fourier Transform) waveform of an output signal obtained when the frequency of the commercial power supply 18 is 50 Hz and the input signal $e_S$ is zero. As compared with the conventional example shown in FIG. 23, ripples are reduced by about 30 dB. Although not shown in the figure, the DC offset is also reduced by about 30 dB.

How Expression 1 is derived will now be described.

Figure 4:
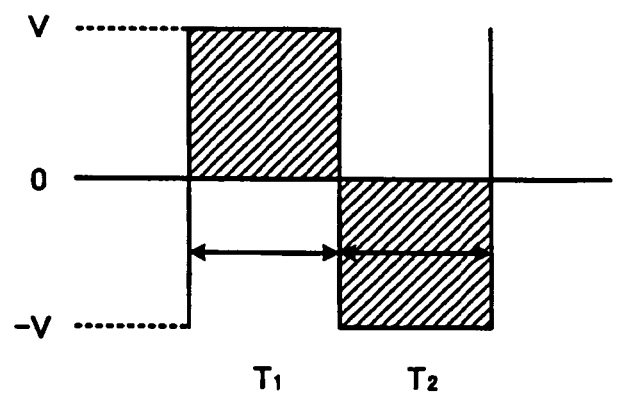
FIG. 4 is a waveform diagram showing an output voltage of a switching output circuit shown in FIG. 1.

Relationship Between Power Supply Voltage and Output Voltage of Switching Output Circuit FIG. 4 shows the waveform of an output voltage of the switching output circuit 16. The average output voltage $V_O$ is a voltage value obtained by dividing the area of the hatched portion by time, and is thus expressed as shown in Expression 4 below.

$$V_o = \frac{VT_1 - VT_2}{T_1 + T_2} \quad (4)$$
$$= \frac{V(T_1 - T_2)}{T_1 + T_2}$$

With a 50% duty ratio, T1=T2 holds true, hence $V_O$=0.

Figure 5:
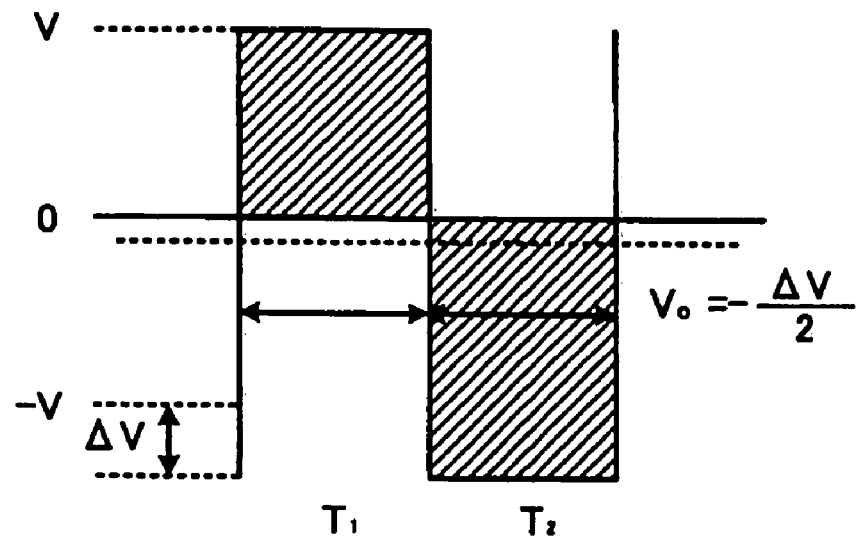
FIG. 5 is a waveform diagram showing an output voltage of the switching output circuit where the negative power supply voltage $-V$ fluctuates by $\Delta V$.

Referring to FIG. 5, when the negative power supply voltage −V fluctuates by ΔV, the average output voltage $V_O$ is expressed as shown in Expression 5 below.

$$V_o = \frac{VT_1 + (-V + \Delta V)T_2}{T_1 + T_2} \quad (5)$$

With a 50% duty ratio, T1=T2 holds true, hence $V_O$=ΔV/2.

Figure 6:
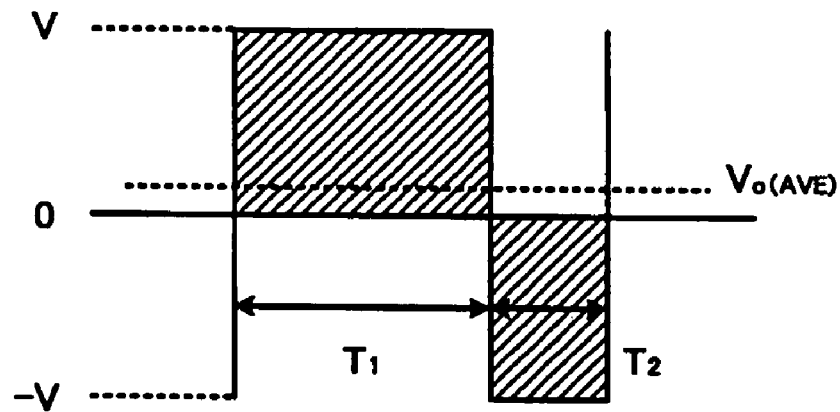
FIG. 6 is a waveform diagram showing an output voltage of the switching output circuit for a particular degree of modulation.

Definition of Degree of Modulation of PWM Circuit and Gain of Switching Amplifier With an output voltage as shown in FIG. 6, the average output voltage $V_{O(AVE)}$ is expressed as shown in Expression 6.

$$V_{o(AVE)} = \frac{VT_1 - VT_2}{T_1 + T_2} = \left(\frac{T_1 - T_2}{T_1 + T_2}\right)V \quad (6)$$

Herein, (T1−T2)/(T1+T2) is defined as the degree of modulation of the PWM circuit 14.

As with the gain of an ordinary analog amplifier, the gain $A_O$ of the switching amplifier 10 is expressed as $V_{O(AVE)} = A_O \cdot e_S$. Therefore, the gain $A_O$ is defined as shown in Expression 7 below.

$$A_o = \frac{V_{o(AVE)}}{e_S} = \frac{\left(\frac{T_1 - T_2}{T_1 + T_2}\right)V}{e_S} \quad (7)$$

As is apparent from Expression 7, the gain $A_O$ of the switching amplifier 10 varies according to the power supply voltage V.

Equivalent Circuit of Fluctuation Detection Circuit

Figure 7:
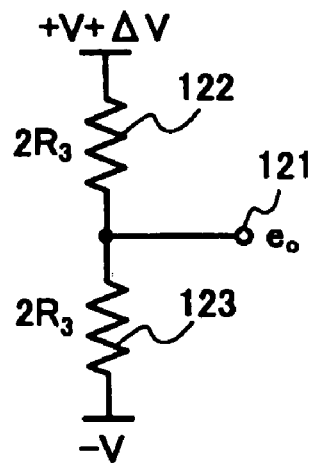
FIG. 7 is a circuit diagram showing a configuration of a fluctuation detection circuit shown in FIG. 1.

Now, an equivalent circuit of the fluctuation detection circuit 12 will be obtained. For this purpose, the resistive voltage division of the fluctuation detection circuit 12 is replaced with a signal source and an output impedance. Where the positive power supply voltage +V fluctuates by ΔV as shown in FIG. 7, a fluctuating signal $e_O$) of the fluctuation detection terminal 121 being in an open state is expressed as shown in Expression 8 below.

$$e_o = \frac{V + \Delta V}{2} + \left(\frac{-V}{2}\right) = \frac{\Delta V}{2} \quad (8)$$

Figure 8:
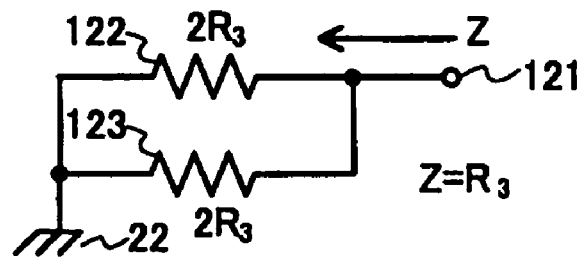
FIG. 8 is a circuit diagram showing an output impedance of the fluctuation detection circuit shown in FIG. 7.
Figure 9:
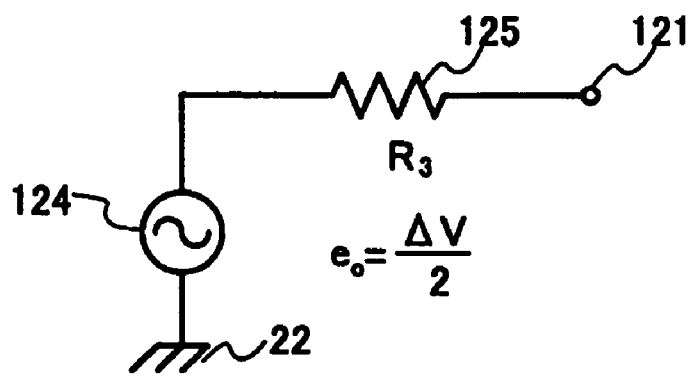
FIG. 9 is a circuit diagram showing an equivalent circuit of the fluctuation detection circuit shown in FIG. 7.

As shown in FIG. 8, the output impedance Z of the fluctuation detection terminal 121 is $Z = R_3$. Therefore, an equivalent circuit of the fluctuation detection circuit 12 includes a signal source 124 and a resistor 125 connected in series with the signal source 124, as shown in FIG. 9.

Relationship Between Resistances $R_1$ to $R_3$ and Open-Loop Gain A

Figure 10:
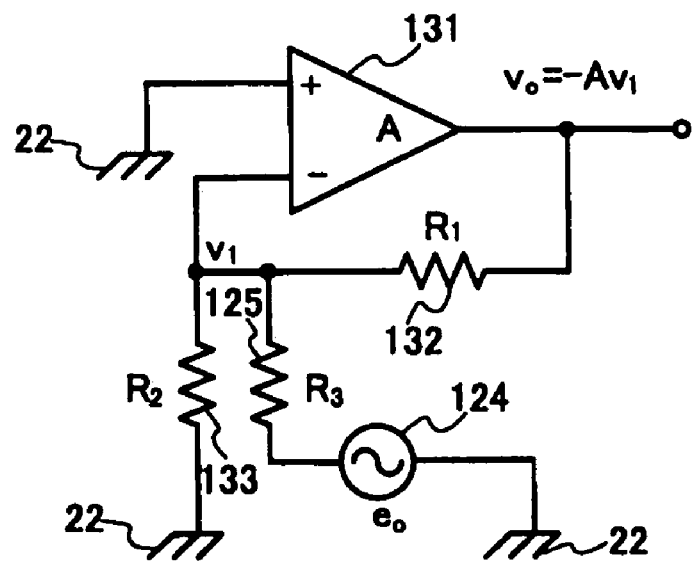
FIG. 10 is a circuit diagram showing an equivalent circuit of the fluctuation detection circuit and the non-inverted amplifier circuit shown in FIG. 1 for a fluctuating signal.

FIG. 10 shows an equivalent circuit of the fluctuation detection circuit 12 and the non-inverted amplifier circuit 13 for the fluctuating signal $e_O$. Where $v_1$ denotes the input signal and $v_O$ the output signal, Expression 9 below holds true.

$$\begin{cases} v_o = -Av_1 \\ \frac{-AV_1 - v_1}{R_1} + \frac{e_o - v_1}{R_3} = \frac{v_1}{R_2} \\ \frac{-(A+1)R_2R_3 - R_1(R_2 + R_3)}{R_1 R_2} v_1 = -e_o \end{cases} \quad (9)$$

Thus, the input signal $v_1$ is expressed as shown in Expression 10 below.

$$v_1 = \frac{R_1 R_2}{(A+1)R_2 R_3 + R_1(R_2 + R_3)} e_o \quad (10)$$

In order to cancel out the fluctuating component of the power supply voltage contained in the output of the switching output circuit 16, it is necessary that $v_O = -e_O$. Therefore, Expression 11 below holds true, thus deriving Expression 1.

$$\begin{cases} v_o = \frac{-AR_1 R_2}{(A+1)R_2 R_3 + R_1(R_2 + R_3)} e_o = -e_o \\ \frac{AR_1 R_2}{(A+1)R_2 R_3 + R_1(R_2 + R_3)} = 1 \\ AR_1 R_2 = (A+1)R_2 R_3 + R_1(R_2 + R_3) \\ (A-1)R_1 R_2 = [(A+1)R_2 + 1]R_3 \end{cases} \quad (11)$$

Gain of Non-Inverted Amplifier Circuit

Figure 11:
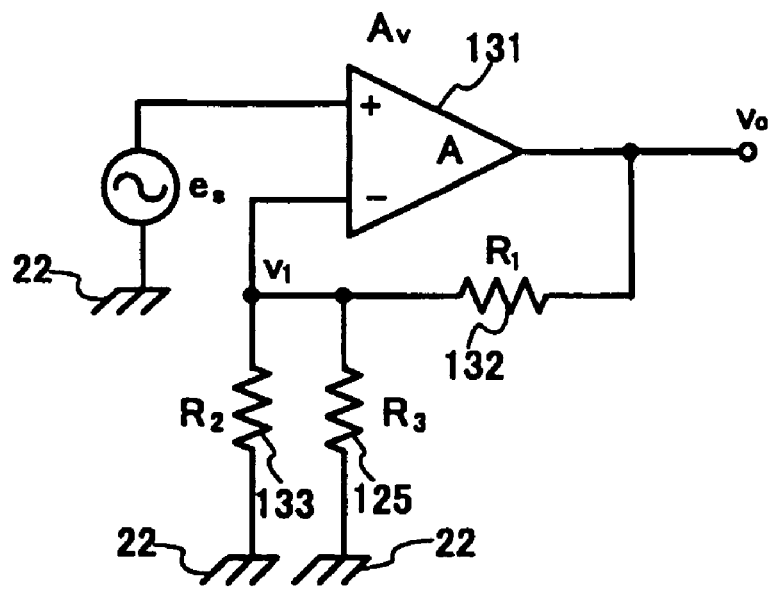
FIG. 11 is a circuit diagram showing an equivalent circuit of the fluctuation detection circuit and the non-inverted amplifier circuit shown in FIG. 1 for an input signal.

FIG. 11 shows an equivalent circuit of the fluctuation detection circuit 12 and the non-inverted amplifier circuit 13 for the input signal $e_S$. Thus, Expression 12 below holds true, thus deriving the gain $A_V$ of the non-inverted amplifier circuit 13.

$$\begin{cases} v_1 = \frac{\frac{R_2 R_3}{R_2 + R_3}}{R_1 + \frac{R_2 R_3}{R_2 + R_3}} v_o = \frac{R_2 R_3}{R_1 R_2 + R_1 R_3 + R_2 R_3} v_o \\ v_o = Ae_s - Av_1 + Ae_s - \frac{AR_2 R_3}{R_1 R_2 + R_1 R_3 + R_2 R_3} v_o \\ \frac{(1+A)R_2 R_3 + R_1(R_2 + R_3)}{R_1 R_2 + R_1 R_3 + R_2 R_3} v_o = Ae_s \\ v_o = \frac{A(R_1 R_2 + R_1 R_3 + R_2 R_3)}{(1+A)R_2 R_3 + R_1(R_2 + R_3)} e_s = A_v e_s \\ A_v = \frac{A(R_1 R_2 + R_1 R_3 + R_2 R_3)}{(1+A)R_2 R_3 + R_1(R_2 + R_3)} \end{cases} \quad (12)$$

SPECIFIC EXAMPLE

In the absence of the fluctuation detection circuit 12, i.e., in the absence of the resistance $R_3$, the gain $A_V$ is expressed as shown in Expression 13 below.

$$A_v = \frac{A(R_1 + R_2)}{(1+A)R_2 + R_1} \quad (13)$$

Assuming A=100, $R_1$=33 KΩ and $R_2$=2.2 KΩ, the gain $A_v$ is "13.79" as shown in Expression 14 below.

$$A_v = \frac{100(33000 + 2200)}{(1+100) \times 2200 + 33000} = \frac{3.52 \times 10^6}{2.552 \times 10^5} = 13.79 \quad (14)$$

In the presence of the fluctuation detection circuit 12, i.e., in the presence of the resistance $R_3$, the resistance $R_3$ is "32 KΩ" as shown in Expression 15 below, based on Expression 1 above.

$$R_3 = \frac{(100-1) \times (33000 \times 2200)}{(100-1) \times 2200 + 1} = 32346 \cong 32\ K(\Omega) \quad (15)$$

The gain $A_V$ is "14.54" as shown in Expression 16 below.

$$\begin{aligned} A_v &= \frac{A(R_1 R_2 + R_1 R_3 + R_2 R_3)}{(1+A)R_2 R_3 + R_1(R_2 + R_3)} \\ &= \frac{100(33000 \times 2200 + 33000 \times 32346 + 2200 \times 32346)}{(1+100)2200 \times 32346 + 33000(2200 + 323461)} \\ &= 14.54 \end{aligned} \quad (16)$$

Assuming V=50 V, the current $I_3$ flowing through the resistors 122 and 123 is "0.78×10–3 A" as shown in Expression 17 below.

$$I_3 = \frac{V - (-V)}{2 \times 2R_3} = \frac{V}{2R_3} = \frac{50}{64000} = 0.78 \times 10^{-3}(A) \quad (17)$$

The power consumption P is "38.9 mW" as shown in Expression 18 below.

$$P = I_3^2 2R_3 = (0.78 \times 10^{-3})^2 \times 32000 \times 2 = 38.9\ (\text{mW}) \quad (18)$$

Thus, according to the present embodiment, there is only a small increase in the power consumption due to the addition of the fluctuation detection circuit 12. Thus, the switching amplifier 10 is practical.

Second Embodiment

Figure 12:
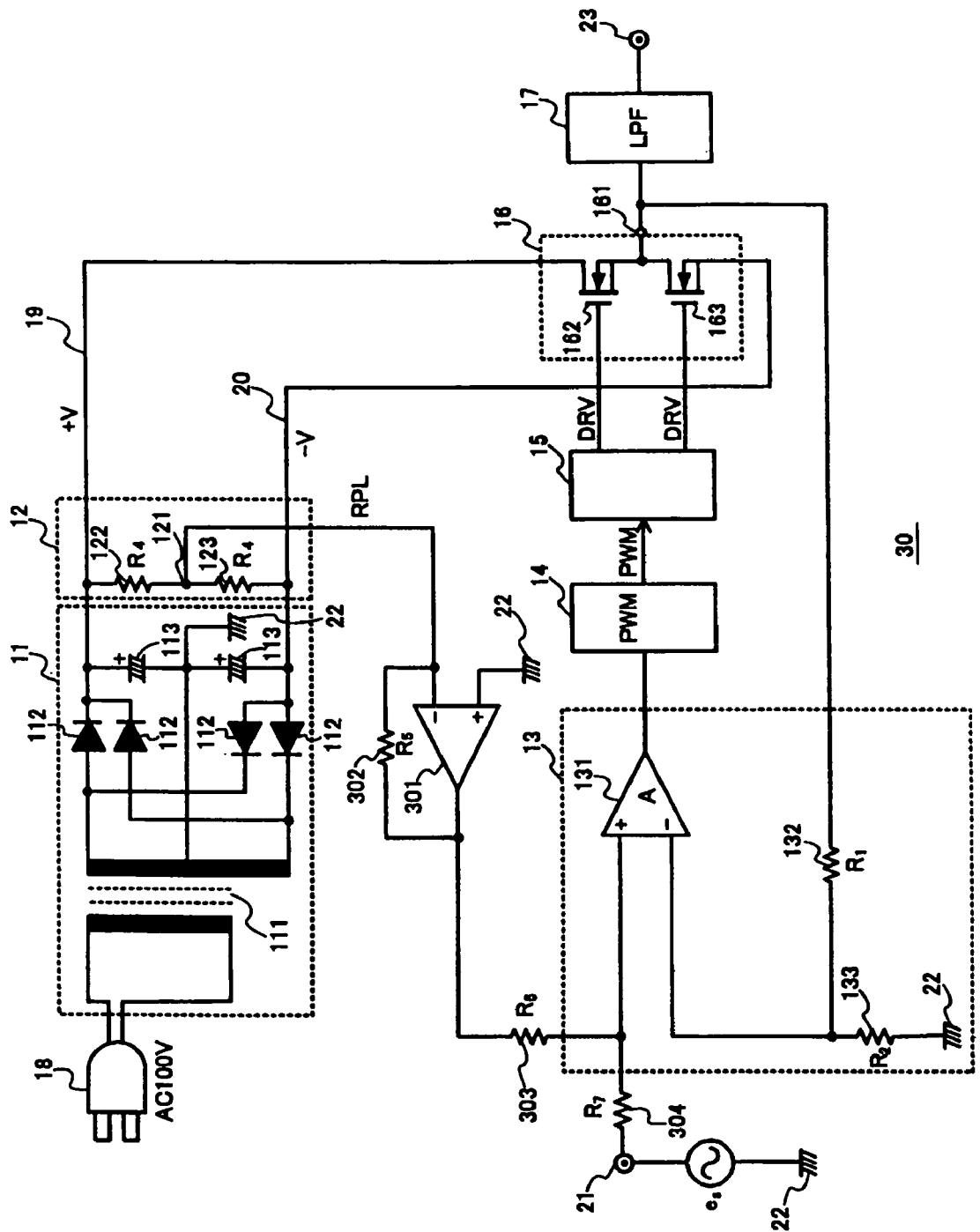
FIG. 12 is a functional block diagram showing a configuration of a switching amplifier according to a second embodiment of the present invention.

Referring to FIG. 12, a switching amplifier 30 according to a second embodiment of the present invention includes a differential amplifier 301, a negative feedback resistor 302 and voltage-dividing resistors 303 and 304, in addition to the elements shown in the first embodiment. The differential amplifier 301 has a non-inverted input terminal connected to the ground 22 and an inverted input terminal connected to the fluctuation detection terminal 121. The negative feedback resistor 302 is connected between the output terminal and the inverted input terminal of the differential amplifier 301. The voltage-dividing resistor 303 is connected between the output terminal of the differential amplifier 301 and the non-inverted input terminal of the differential amplifier 131. A voltage-dividing resistor 304 is connected between the input terminal 21 and the non-inverted input terminal of the differential amplifier 131.

Figure 13:
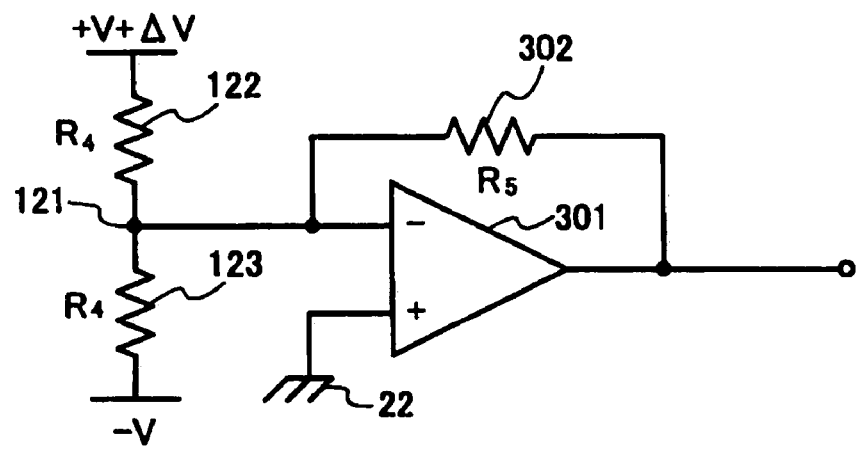
FIG. 13 is a circuit diagram showing a configuration of an inverted amplifier circuit shown in FIG. 12.

The resistors 122, 123 and 302 and the differential amplifier 301 together form an inverted amplifier circuit, as shown in FIG. 13. In the present embodiment, this inverted amplifier circuit inverts the fluctuating signal RPL. The output voltage from the inverted amplifier circuit is divided by the resistors 303 and 304, whereby the inverted fluctuating signal is mixed into the input signal $e_S$.

Where $R_4$ denotes the resistance value of the detection resistors 122 and 123, $R_5$ that of the negative feedback resistor 302, $R_6$ that of the voltage-dividing resistor 303 and $R_7$ that of the voltage-dividing resistor 304, $R_1$, $R_2$, $R_4$ to $R_7$ and A are determined so as to satisfy Expression 2 below.

$$\left(\frac{R_7}{R_6+R_7}\right)\left(\frac{2R_5}{R_4}\right)\left\{\frac{A(R_1+R_2)}{(1+A)R_2+R_1}\right\}=1 \qquad (2)$$

How Expression 2 is derived will now be described.

Figure 14:
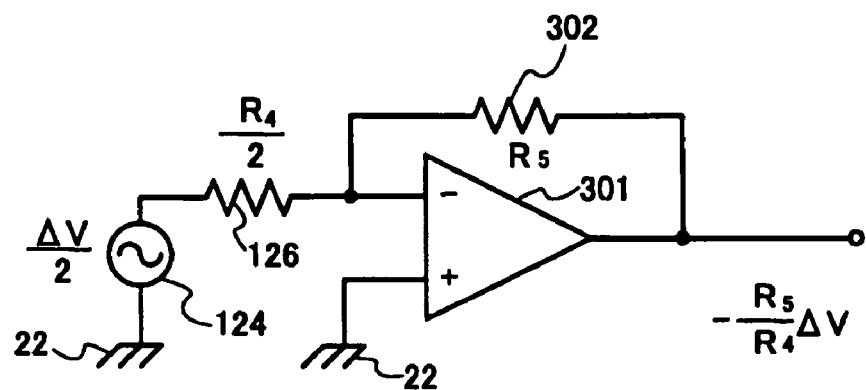
FIG. 14 is a circuit diagram showing an equivalent circuit of the inverted amplifier circuit shown in FIG. 13.

FIG. 14 shows an equivalent circuit of the inverted amplifier circuit shown in FIG. 13 for the fluctuating voltage ΔV/2. The detection resistors 122 and 123 are replaced with the signal source 124 of ΔV/2 and an output impedance 126 of $R_4/2$.

Figure 15:
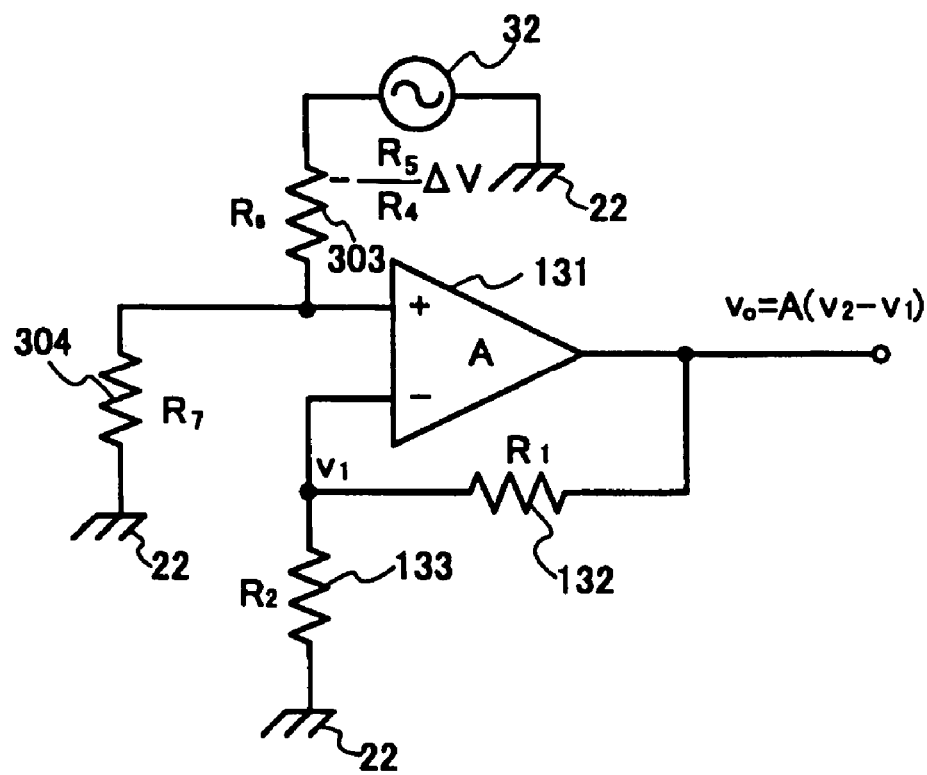
FIG. 15 is a circuit diagram showing an equivalent circuit of the inverted amplifier circuit shown in FIG. 14, voltage-dividing resistors and a non-inverted amplifier circuit.

FIG. 15 shows an equivalent circuit of the inverted amplifier circuit shown in FIG. 14, the voltage-dividing resistors 303 and 304 and the non-inverted amplifier circuit. The inverted amplifier circuit shown in FIG. 14 is replaced with a signal source 32 of $-(R_5/R_4)\Delta V$. Where $v_2$ denotes the input signal supplied to the non-inverted input terminal of the differential amplifier 131, Expression 19 below holds true.

$$\begin{cases} v_o = A(v_2 - v_1) \quad v_1 = v_2 - \dfrac{v_o}{A} \\[4pt] v_1 = v_o\left(\dfrac{R_2}{R_1+R_2}\right) \\[4pt] v_2 - \dfrac{v_o}{A} = v_o\left(\dfrac{R_2}{R_1+R_2}\right) \quad Av_2 = v_o\left(\dfrac{AR_2}{R_1+R_2}+1\right) \\[4pt] v_o = \dfrac{Av_2}{\dfrac{AR_2}{R_1+R_2}+1} = \dfrac{A(R_1+R_2)}{AR_2+R_1+R_2}v_2 = \dfrac{A(R_1+R_2)}{(1+A)R_2+R_1}v_2 \\[4pt] v_2 = -\left(\dfrac{R_7}{R_6+R_7}\right)\left(\dfrac{R_5}{R_4}\right)\Delta V \\[4pt] v_o = -\left(\dfrac{R_7}{R_6+R_7}\right)\left(\dfrac{R_5}{R_4}\right)\left\{\dfrac{A(R_1+R_2)}{(1+A)R_2+R_1}\right\}\Delta V \end{cases} \qquad (19)$$

The fluctuating component ΔV/2 of the power supply voltage is contained in the output of the switching output circuit 16, and in order to cancel out the fluctuating component ΔV/2, it is necessary that $v_O=-\Delta V/2$. Therefore, Expression 20 below holds true, thus deriving Expression 2 above.

$$-\frac{\Delta V}{2} = -\left(\frac{R_7}{R_6+R_7}\right)\left(\frac{R_5}{R_4}\right)\left\{\frac{A(R_1+R_2)}{(1+A)R_2+R_1}\right\}\Delta V \qquad (20)$$

Thus, according to the present embodiment, the detected fluctuating signal RPL is inverted through the differential amplifier 301 and supplied to the non-inverted input terminal of the differential amplifier 131. Therefore, as in the first embodiment above, the fluctuating signal RPL is not inverted through the differential amplifier 131.

Third Embodiment

Figure 16:
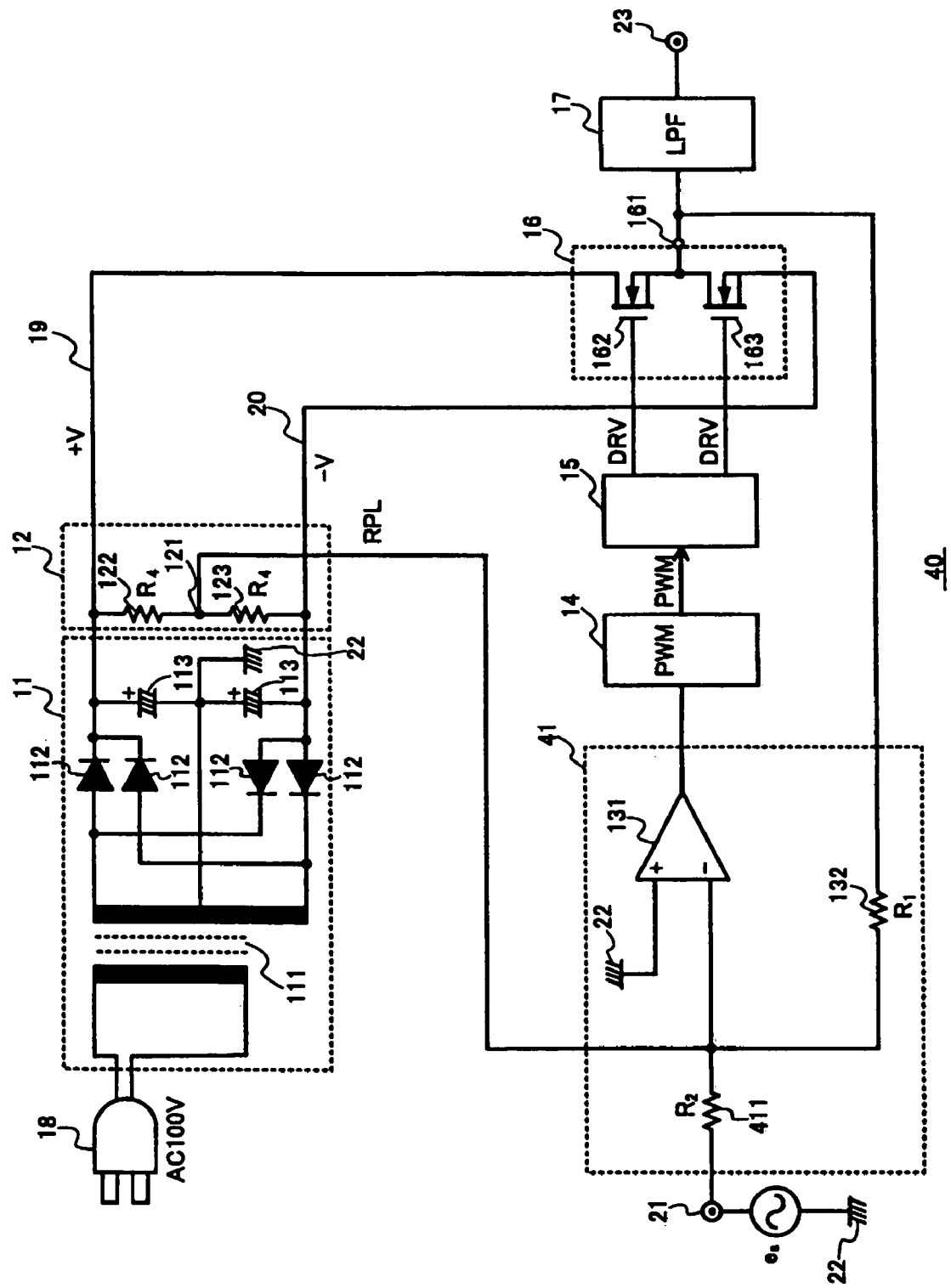
FIG. 16 is a functional block diagram showing a configuration of a switching amplifier according to a third embodiment of the present invention.

Referring to FIG. 16, a switching amplifier 40 according to a third embodiment of the present invention includes an inverted amplifier circuit 41 for amplifying the input signal $e_S$ and supplying the amplified signal to the PWM circuit 14, instead of the non-inverted amplifier circuit 13 of the first embodiment. The inverted amplifier circuit 41 includes the differential amplifier 131, the negative feedback resistor 132 and an input resistor 411. The non-inverted input terminal of the differential amplifier 131 is connected to the ground 22, and the inverted input terminal thereof is connected to the fluctuation detection terminal 121. The input resistor 411 is connected between the input terminal 21 and the inverted input terminal of the differential amplifier 131. In the present embodiment, the fluctuating signal RPL is inverted through the inverted amplifier circuit 41 and mixed into the input signal $e_S$.

Where $R_4$ denotes the resistance value of the detection resistors 122 and 123 and $R_2$ that of the input resistor 411, $R_1$, $R_2$, $R_4$ and A are determined so as to satisfy Expression 3 below.

$$R_4 = \frac{2(A-1)R_1 R_2}{(A+1)R_2 + R_1} \qquad (3)$$

Figure 17:
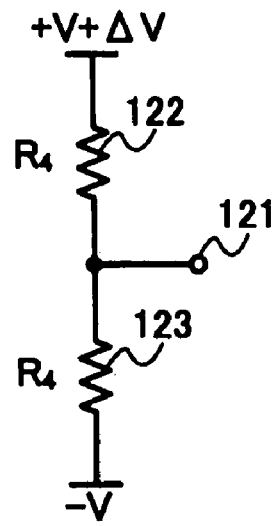
FIG. 17 is a circuit diagram showing a configuration of a fluctuation detection circuit shown in FIG. 16.
Figure 18:
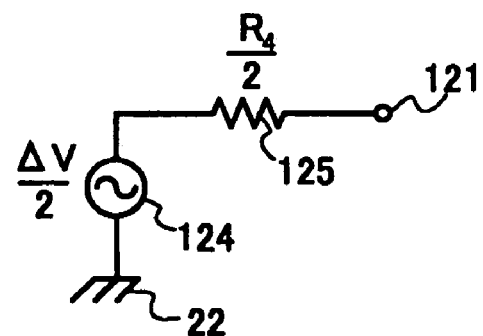
FIG. 18 is a circuit diagram showing an equivalent circuit of the fluctuation detection circuit shown in FIG. 17.
Figure 19:
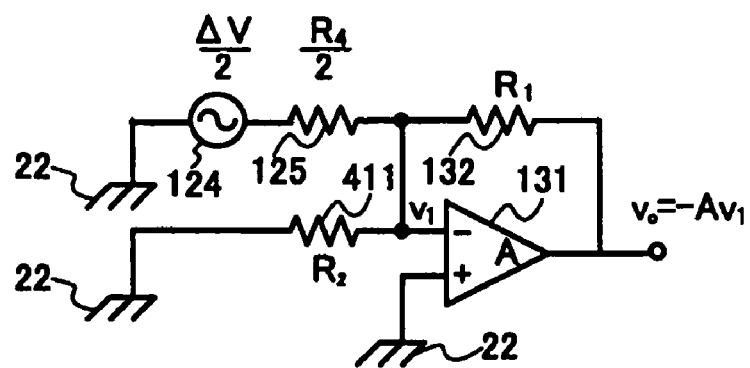
FIG. 19 is a circuit diagram showing an equivalent circuit of the fluctuation detection circuit and an inverted amplifier circuit shown in FIG. 16 for a fluctuating signal.

How Expression 3 is derived will now be described.

Where $R_4$ denotes the resistance value of the detection resistors 122 and 123 of the fluctuation detection circuit 12 as shown in FIG. 17, an equivalent circuit of the fluctuation detection circuit 12 is made up of the signal source 124 of ΔV/2 and the output impedance 125 of $R_4/2$ as shown in FIG. 18. An equivalent circuit of the inverted amplifier circuit 41 and the fluctuation detection circuit 12 is as shown in FIG. 19. As is apparent from FIG. 19, the inverted amplifier circuit 41 and the fluctuation detection circuit 12 together form an adder circuit for adding together the input signal and the fluctuating signal. Therefore, Expression 21 below holds true.

$$\begin{cases} v_o = -Av_1 \\[4pt] \dfrac{-Av_1 - v_1}{R_1} + \dfrac{\Delta V - 2v_1}{R_4} = \dfrac{v_1}{R_2} \\[4pt] \dfrac{R_4(-Av_1 - v_1) + R_1(\Delta V - 2v_1)}{R_1 R_4} = \dfrac{v_1}{R_2} \\[4pt] R_2 R_4(-Av_1 - v_1) + R_1 R_2(\Delta V - 2v_1) = R_1 R_4 v_1 \\[4pt] \dfrac{-(A+1)R_2 R_4 - R_1(2R_2 + R_4)}{R_1 R_2}v_1 = -\Delta V \\[4pt] v_1 = \dfrac{R_1 R_2}{(A+1)R_2 R_4 + R_1(2R_2 + R_4)}\Delta V \end{cases} \qquad (21)$$

The fluctuating component ΔV/2 of the power supply voltage is contained in the output of the switching output circuit 16, and in order to cancel out the fluctuating component ΔV/2, it is necessary that $v_O=-\Delta V/2$. Therefore, Expression 22 below holds true, thus deriving Expression 3 above.

$$\begin{cases} v_o = \dfrac{AR_1 R_2}{(A+1)R_2 R_4 + R_1(2R_2 + R_4)}\Delta V = -\dfrac{\Delta V}{2} \\[4pt] \dfrac{2AR_1 R_2}{(A+1)R_2 R_4 + R_1(2R_2 + R_4)} = 1 \\[4pt] 2AR_1 R_2 = \{(A+1)R_2 + R_1\}R_4 + 2R_1 R_2 \end{cases} \qquad (22)$$

Thus, according to the present embodiment, the detected fluctuating signal RPL is added with the input signal $e_S$ and inverted through the inverted amplifier circuit 41.

Fourth Embodiment

Figure 20:
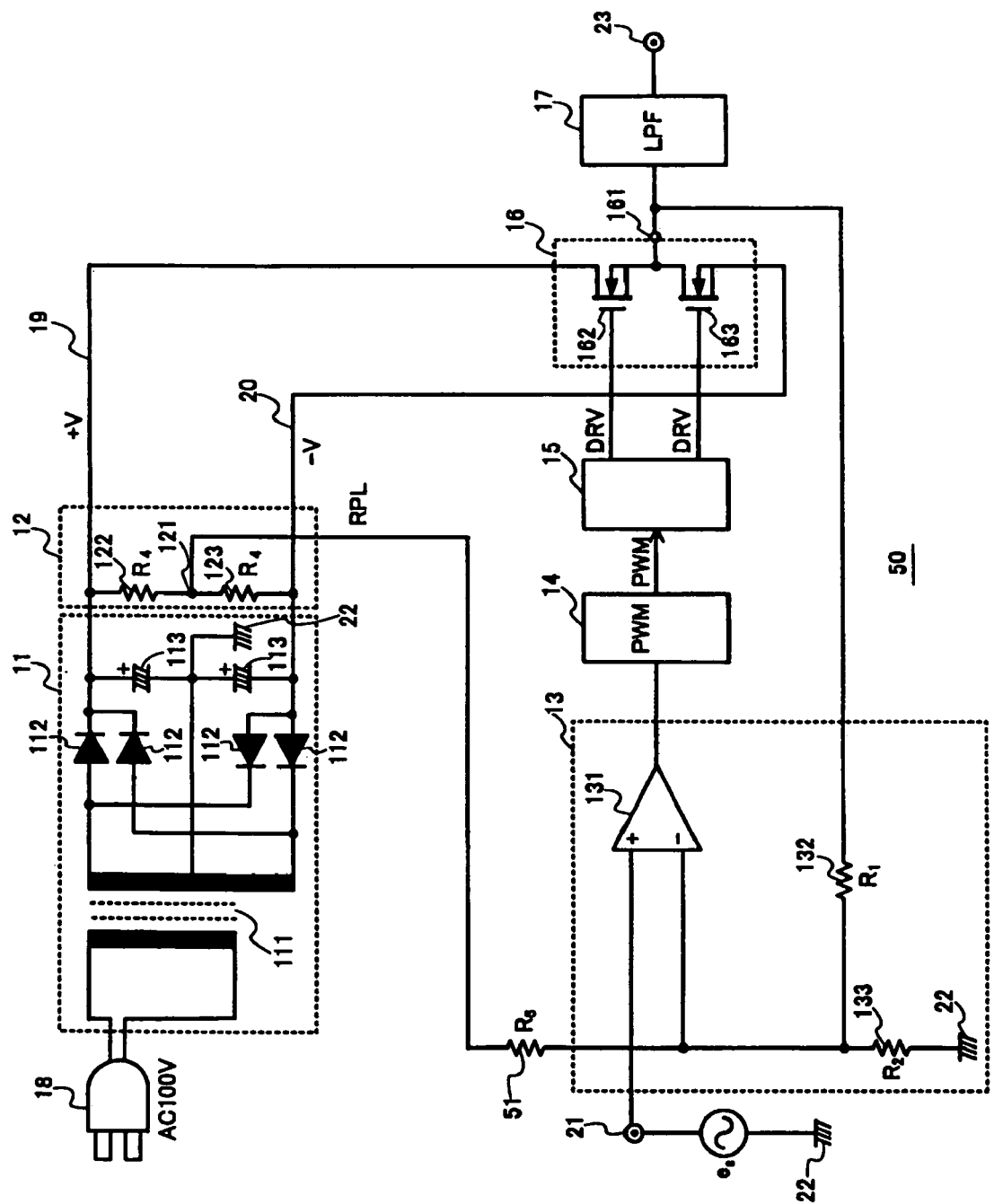
FIG. 20 is a functional block diagram showing a configuration of a switching amplifier according to a fourth embodiment of the present invention.
Figure 21:
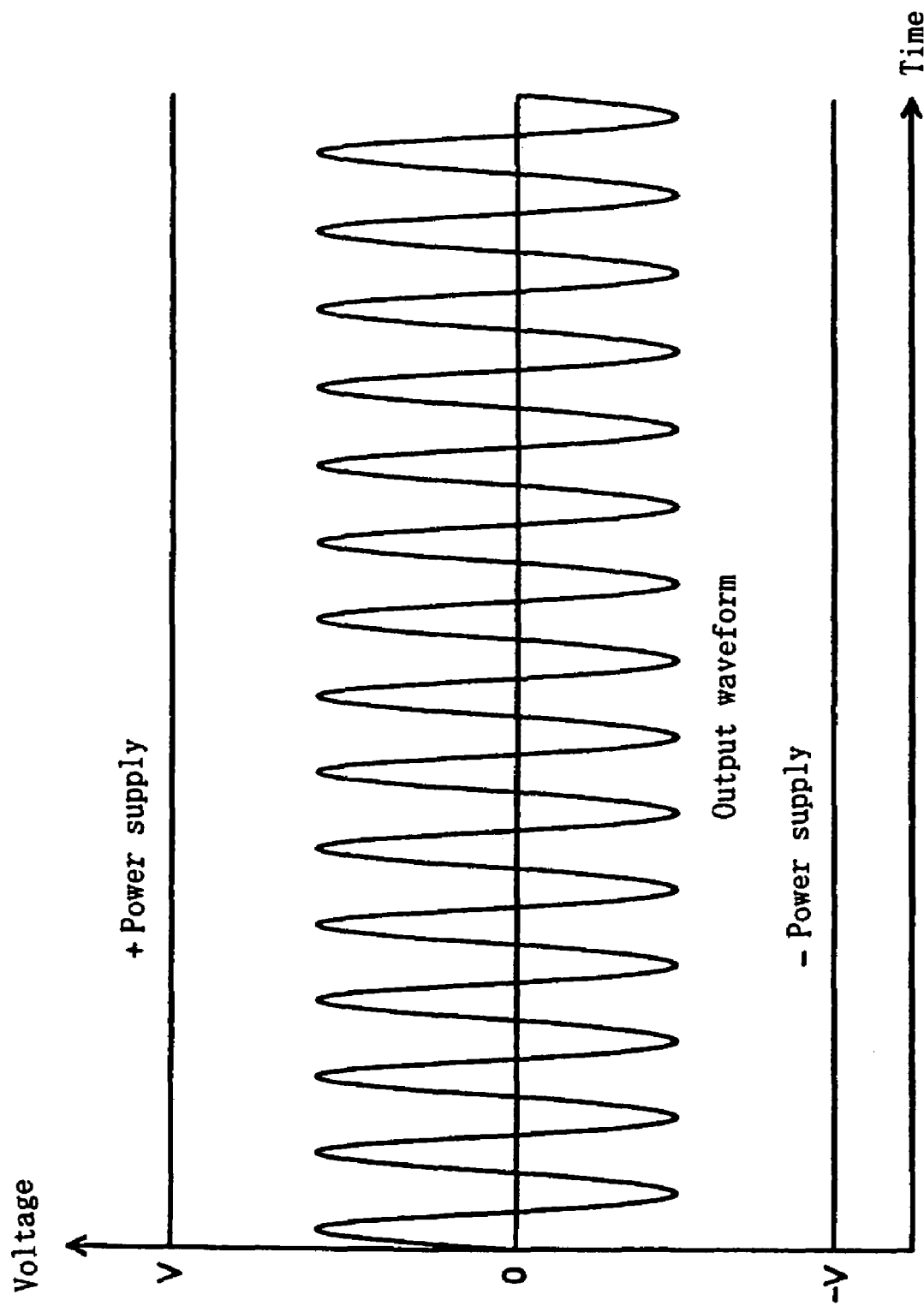
FIG. 21 is a waveform diagram showing an output voltage of a switching output circuit in response to a sine-wave input signal where the power supply voltage is constant.
Figure 22:
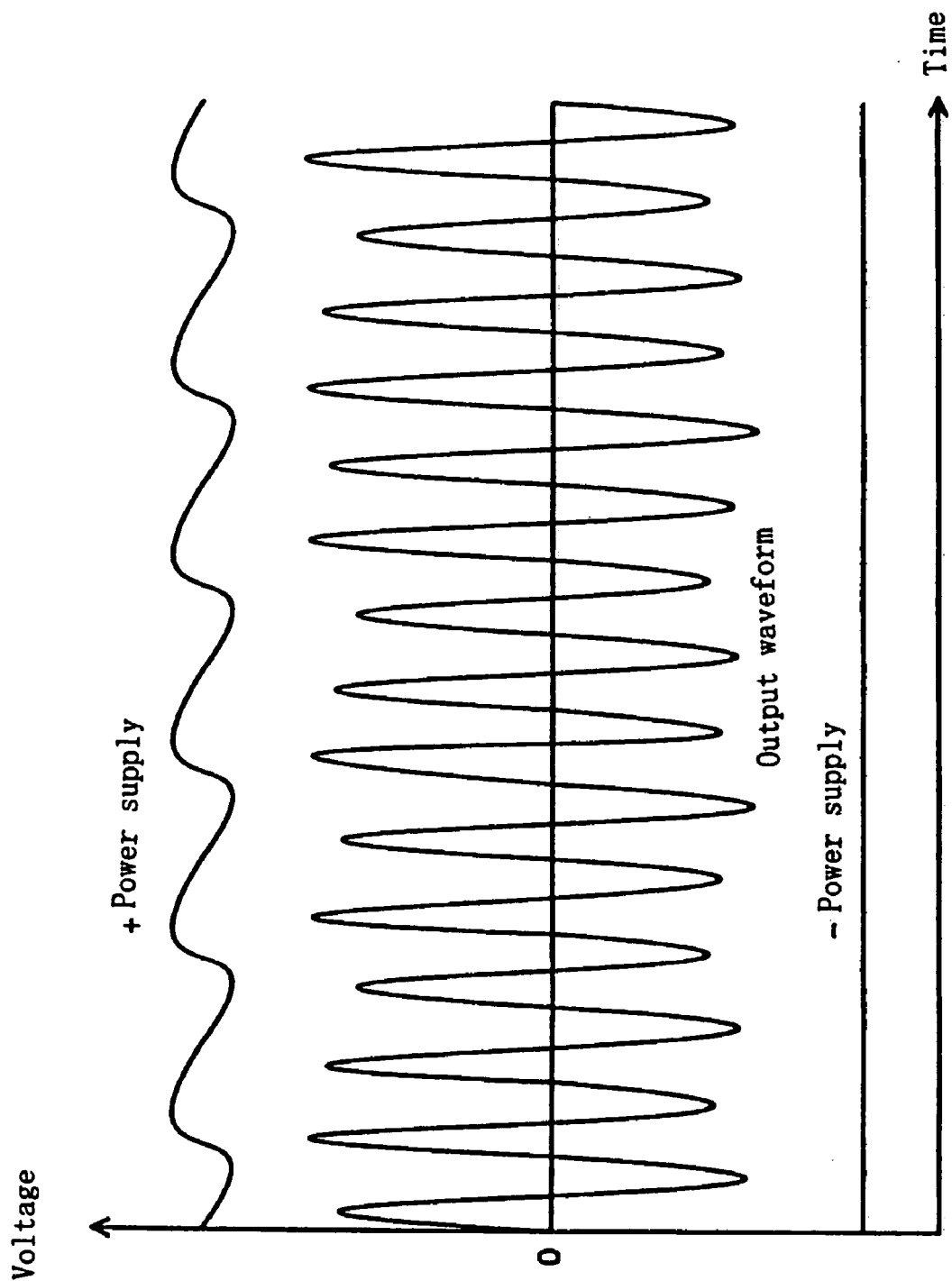
FIG. 22 is a waveform diagram showing an output voltage of a switching output circuit in response to a sine-wave input signal where the positive power supply voltage fluctuates.

Referring to FIG. 20, a switching amplifier 50 according to a fourth embodiment of the present invention includes a variable resistor 51, in addition to the elements shown in the first embodiment. The variable resistor 51 is connected between the fluctuation detection terminal 121 and the inverted input terminal of the differential amplifier 131.

Where $R_4$ denotes the resistance value of the detection resistors 122 and 123 and $R_6$ that of the variable resistor 51, the various expressions shown in the first embodiment above hold true if "$R_3$" is substituted with "$R_4+R_6$".

According to the present embodiment, the fluctuating component of the power supply voltage contained in the output of the switching output circuit 16 can be canceled out substantially completely by manually or automatically adjusting the variable resistor 51.

While a PWM circuit is used as a pulse modulation circuit in the embodiments above, a PDM circuit for modulating the pulse density of the input signal $e_S$ to obtain a PDM signal may be used in other embodiments.

While a double power supply system is used in the embodiments above, a single power supply system may be used in other embodiments. Thus, in the embodiments above, one of the positive and negative power supply voltages may be replaced with a ground potential. Alternatively, the power supply voltages in the embodiments above may be both positive or both negative.

The combination of the transistors 162 and 163 of the switching output circuit 16 is not limited to the N-channel and N-channel combination, but may be a P-channel and P-channel combination or an N-channel and P-channel combination in other embodiments. Instead of using MOS-FETs, any other suitable types of switching elements such as bipolar transistors may be used.

While the present invention has been described above in preferred embodiments, it is understood that these embodiments are merely illustrative of how the invention may be carried out, and it is apparent to those skilled in the art that variations and modifications thereof can be made without departing from the spirit and scope of the invention.

The switching amplifier of the present invention is particularly useful as an audio power amplifier.

What is claimed is:

1. A switching amplifier, comprising:
    a pulse modulation circuit for outputting a pulse-modulated signal in response to an input signal supplied to an input terminal thereof;
    a switching output circuit connected to first and second power supplies for outputting a first or second power supply voltage in response to the pulse-modulated signal;
    a first resistor connected between the first power supply and a fluctuation detection terminal;
    a second resistor connected between the second power supply and the fluctuation detection terminal; and
    an inversion circuit for inverting a fluctuating signal occurring at the fluctuation detection terminal and mixing the inverted fluctuating signal into the input signal,
    wherein the inversion circuit includes a non-inverted amplifier circuit for amplifying the input signal and supplying the amplified input signal to the pulse modulation circuit.

2. A switching amplifier according to claim 1, wherein the non-inverted amplifier circuit includes:
    a differential amplifier including a non-inverted input terminal connected to the input terminal and an inverted input terminal connected to the fluctuation detection terminal;
    a third resistor connected between an output terminal of the switching output circuit and the inverted input terminal of the differential amplifier; and
    a fourth resistor connected between the inverted input terminal of the differential amplifier and a ground.

3. A switching amplifier according to claim 2, wherein where $2R_3$ denotes a resistance value of the first and second resistors, $R_1$ that of the third resistor, $R_2$ that of the fourth resistor and A an open-loop gain of the differential amplifier, $R_1$ to $R_3$ and A satisfy Expression 1 below $$R_3 = \frac{(A-1)R_1R_2}{(A+1)R_2+R_1}. \tag{1}$$

4. A switching amplifier according to claim 2, further comprising a variable resistor connected between the fluctuation detection terminal and the inverted input terminal of the differential amplifier.

5. A switching amplifier, comprising:
    a pulse modulation circuit for outputting a pulse-modulated signal in response to an input signal supplied to an input terminal thereof;
    a switching output circuit connected to first and second power supplies for outputting a first or second power supply voltage in response to the pulse-modulated signal;
    a first resistor connected between the first power supply and a fluctuation detection terminal;
    a second resistor connected between the second power supply and the fluctuation detection terminal; and
    an inversion circuit for inverting a fluctuating signal occurring at the fluctuation detection terminal and mixing the inverted fluctuating signal into the input signal,
    further comprising a non-inverted amplifier circuit for amplifying the input signal and supplying the amplified input signal to the pulse modulation circuit, the non-inverted amplifier circuit including:
    a first differential amplifier including a non-inverted input terminal connected to the input terminal and an inverted input terminal;
    a third resistor connected between an output terminal of the switching output circuit and the inverted input terminal of the first differential amplifier; and
    a fourth resistor connected between the inverted input terminal of the first differential amplifier and a ground, the inversion circuit including:
    a second differential amplifier including a non-inverted input terminal connected to a ground and an inverted input terminal connected to the fluctuation detection terminal;
    a fifth resistor connected between an output terminal of the second differential amplifier and the inverted input terminal of the second differential amplifier;
    a sixth resistor connected between the output terminal of the second differential amplifier and the non-inverted input terminal of the first differential amplifier; and
    a seventh resistor connected between the input terminal and the non-inverted input terminal of the first differential amplifier.

6. A switching amplifier according to claim 5, where $R_4$ denotes a resistance value of the first and second resistors, $R_1$ that of the third resistor, $R_2$ that of the fourth resistor, $R_5$ that of the fifth resistor, $R_6$ that of the sixth resistor, $R_7$ that of the seventh resistor and A an open-loop gain of the first differential amplifier, $R_1$, $R_2$, $R_4$ to $R_7$ and A satisfy Expression 2 below $$\left(\frac{R_7}{R_6+R_7}\right)\left(\frac{2R_5}{R_4}\right)\left\{\frac{A(R_1+R_2)}{(1+A)R_2+R_1}\right\}=1. \qquad (2)$$

7. A switching amplifier, comprising:
a pulse modulation circuit for outputting a pulse-modulated signal in response to an input signal supplied to an input terminal thereof;
a switching output circuit connected to first and second power supplies for outputting a first or second power supply voltage in response to the pulse-modulated signal;
a first resistor connected between the first power supply and a fluctuation detection terminal;
a second resistor connected between the second power supply and the fluctuation detection terminal; and
an inversion circuit for inverting a fluctuating signal occurring at the fluctuation detection terminal and mixing the inverted fluctuating signal into the input signal,
wherein the inversion circuit includes an inverted amplifier circuit for amplifying the input signal and supplying the amplified input signal to the pulse modulation circuit;
wherein the inverted amplifier circuit includes:
a differential amplifier including a non-inverted input terminal connected to a ground and an inverted input terminal connected to the fluctuation detection terminal;
a third resistor connected between an output terminal of the switching output circuit and the inverted input terminal of the differential amplifier; and
a fourth resistor connected between the input terminal and the inverted input terminal of the differential amplifier.

8. A switching amplifier according to claim 7, wherein where $R_4$ denotes a resistance value of the first and second resistors, $R_1$ that of the third resistor, $R_2$ that of the fourth resistor and A an open-loop gain of the differential amplifier, $R_1$, $R_2$, $R_4$ and A satisfy Expression 3 below $$R_4=\frac{2(A-1)R_1R_2}{(A+1)R_2+R_1}. \qquad (3)$$

* * * * *